United States Patent [19]
Boyette, Jr. et al.

[11] Patent Number: 5,550,483
[45] Date of Patent: Aug. 27, 1996

[54] HIGH SPEED TEST PROBE POSITIONING SYSTEM

[75] Inventors: James E. Boyette, Jr., Delray Beach; James M. Hammond; Jiann-Chang Lo, both of Boca Raton; James C. Mahlbacher, Lake Worth; Michael Servedio; Ali R. Taheri, both of Boca Raton, all of Fla.

[73] Assignee: International Business Machines, Armonk, N.Y.

[21] Appl. No.: 342,433

[22] Filed: Nov. 18, 1994

[51] Int. Cl.$^6$ .................................................. G01R 31/02
[52] U.S. Cl. ......................... 324/758; 324/755; 324/754
[58] Field of Search .............................. 324/158.1, 73.1, 324/754, 758, 755, 537, 761; 250/306, 307; 439/482, 824; 269/71, 73

[56] References Cited

U.S. PATENT DOCUMENTS

| | | | |
|---|---|---|---|
| 4,527,119 | 7/1985 | Rogers et al. | 324/758 |
| 4,912,822 | 4/1990 | Zbeblick et al. | 250/306 |
| 4,987,303 | 1/1991 | Takase et al. | 324/662 |
| 5,187,367 | 2/1993 | Miyazaki et al. | 250/306 |
| 5,214,342 | 5/1993 | Yang | 310/328 |
| 5,223,713 | 6/1993 | Uozumi et al. | 250/306 |
| 5,404,111 | 4/1995 | Mori et al. | 324/758 |
| 5,461,323 | 10/1995 | Yanagi et al. | 324/754 |
| 5,467,020 | 11/1995 | Boyette et al. | 324/754 |

OTHER PUBLICATIONS

"Design for a Planar XY Robotic Fine Positioning Device", R. L. Hollis, article *Robotics and Manufacturing Automation*, American Soc. of Mechanical Engineers PED–vol. 15, pp. 291–298, Nov. 17–22, 1985.

"Enhancement of Robot Accuracy using Endpoint Feedback and a Macro–Micro Manipulator System", Andre Sharon, 1984 American Control Conference publication, vol. 3, pp. 1836–1842, Jun. 6, 1984.

"The Hummingbird Minipositioner—Providing Three–Axis Motion at 50 G's with Low Reactions", Karidis, et al., IBM Research Report, Sep. 18, 1991.

"Piezoelectric XY Translator", J. G. Bednorz, et al. IBM Technical Disclosure Bulletin, vol. 26, No. 10A, Mar., 1984.

*Primary Examiner*—Vinh P. Nguyen
*Attorney, Agent, or Firm*—Anthony N. Magistrale; Calfee, Halter & Griswold

[57] ABSTRACT

Probing system performance is improved by dynamically positioning a test probe at a test site during the gantry settling interval using a high performance secondary positioner to compensate for the inherent moving mass oscillational displacements. A primary positioner positions the gantry and its associated test probe to within a predetermined axis distance of the test site and a secondary positioner dynamically maintains the test probe at a target position corresponding to the test site during the settling interval by imparting compensating displacements to the test probe to counteract the displacement errors incurred as the primary positioner attempts to settle the gantry at the test site. Similarly, automatic machine tool performance is improved by dynamically positioning a work tool at a work site during the gantry settling interval using a high performance secondary positioner to compensate for the inherent moving mass oscillational displacements. A primary positioner positions the gantry and its associated work tool to within a predetermined axis distance of the work site and a secondary positioner dynamically maintains the work tool at a target position corresponding to the work site during the settling interval by imparting compensating displacements to the work tool to counteract the displacement errors incurred as the primary positioner attempts to settle the gantry at the work site.

32 Claims, 3 Drawing Sheets

HIGH SPEED TEST PROBE POSITIONING SYSTEM

FIELD OF THE INVENTION

The present invention relates generally to high-speed automatic machine systems employing positioning devices for controlling work tool movement either to successive work sites of a workpiece or to successive workpieces, and, more specifically, to high-speed probing systems employing positioning devices for controlling test probe movement to either successive target positions of a device under test or to successive devices to be tested. The invention provides an improved performance positioning system method and apparatus using a primary positioner for positioning a gantry and its associated work tool or test probe within a predetermined distance from a selected work site or test point, and a secondary positioner for maintaining the work tool or test probe in a substantially fixed relation to the selected work site or test point during the gantry settling interval.

BACKGROUND OF THE INVENTION

Electronic testing conducted using an automatic probing system requires high-speed performance in order to minimize the number of testers needed to meet manufacturing throughput requirements. Testing of fine-pitch electronic circuit boards is usually done with either a cluster prober or a serial prober. Cluster probers are useful for high density testing, but have the disadvantage of requiring large capital investment for custom probe heads for each product type. Alternatively, serial probers have the advantage permitting probe positioning in a data-driven fashion using programmable map data for selecting successive target positions, and thus can easily be adapted to accommodate testing of a variety of products. However, a disadvantage of serial probers is that they require longer overall test periods for testing highly dense electronic circuit boards compared to cluster probers. Another disadvantage of serial probers is the introduction of test delays which result from the inherent settling time associated with high-speed moving mass systems, e.g., gantry systems, and which are incurred each time the test probe is positioned at a test point target position.

Serial probing systems provide a technique to test fine pitch electronic circuit boards by moving the test probe tip into contact with the circuitry to be tested with a test probe actuator. To take electronic test measurements, a test probe actuator first disengages the test probe from the first test site. Next, the test probe is moved to the next successive test point. After the gantry vibratory motion is stabilized, the test probe is then engaged with the next successive test site by the test probe actuator. Finally, the test measurement is made. This process is repeated until the desired testing of the multiple test sites is completed. The movement of the gantry from one test point to another is monitored and automatically controlled by an x-axis positioning feedback loop and a y-axis positioning feedback loop. Depending on the location of the next successive test point target position, the x-axis gantry positioner and the y-axis gantry positioner can operate either individually, sequentially, or simultaneously to move the gantry to the next test point target position.

In a typical probing process of an electronic device, the gantry is moved to the vicinity of a test point target position. This is followed by a wait period during which the gantry settles at the test point target position. After gantry settling has occurred, the test probe is engaged to the test site by a test probe actuator, a test measurement is made, and the test probe is disengaged from the test site by the test probe actuator. This process is repeated for the testing of successive test sites.

Automatic probing systems typically locate the test probe with respect to test point target positions of a device to be tested. This is usually accomplished with positioning mechanisms which move the test probe over the surface of the device to be tested. After positioning the test probe at the target position, the test probe is engaged to the test site by the test probe actuator to permit a test measurement to be made. After the test measurement has been made, the test probe is disengaged from the test site by the test probe actuator to permit the cycle to be repeated for positioning the test probe to the next successive target position. The test probe can be engaged to the test site either by moving the test probe to the device under test, moving the device under test to the test probe, or moving both the test probe and the device under test toward one another. Similarly, the test probe can be disengaged from the test site either by moving the test probe away from the device under test, by moving the device under test away from the test probe, or moving both the test probe and the device under test away from one another.

A typical positioning mechanism is capable of very large accelerations and is able to move a test probe to a test site relatively quickly. An inherent disadvantage in using these systems is that the positioning mechanism moving mass is large and is difficult to stop and hold to a high degree of accuracy. The larger the working range of the probing system, the larger and heavier the structures required to support the device under test and the test probe, and the longer it takes for the positioning mechanism to settle the moving mass with a high degree of accuracy. Both the test probe positioning bandwidth and the gantry vibratory motion within that positioning bandwidth affect the amount of physical contact and consequent damage to the test probe and to the device under test.

A high performance serial probing system must be responsive, accurate, reliable, and capable of operating without damaging either the device under test or the test probe. To achieve this performance level, large power linear motors or rotary motors are used to move the gantry and the associated test probe with very large positive acceleration, very high transit speed, and very large negative acceleration to successive test point target positions. However, due to the inherent inertia and structural flexibility of the materials comprising this moving mass, the gantry moving mass exhibits vibratory motion as it settles m the test point target position. The settling period necessary to substantially eliminate the gantry vibratory motion can account for as much as 50% of the total test probe move time to successive test point target positions. The gantry vibratory motion is transmitted to the test probe and affects the degree of probing accuracy and the amount of damage which will occur to the device under test and the test probe. To improve probing accuracy and to reduce damage to the device under test and the test probe, it is necessary for the probing system to be idled and to wait for the gantry vibratory motion to decay to within an acceptable range before the test probe and the device being tested can be engaged with one another to permit a test measurement to be made.

For a serial probing system, the test sequence protocol permits the test probe to be positioned m target positions for testing test sites in an arbitrary order. Thus, an optimal test sequence protocol provides for positioning the test probe to the next nearest target position for testing a test site such that the probing sequence comprises many successive short moves and the overall test time is minimized. However, such a serial testing sequence is significantly influenced by the gantry settling time. While this optimal test sequence protocol minimizes the overall serial test time, it exacerbates the affects of the gantry settling time because the settling time accounts for a relatively large percentage of the total time required to perform each serial probing maneuver to successive test point target positions. Typically, as much as fifty percent of the total test probe move time to successive test point target positions is required for the gantry positioner to settle the gantry to within an acceptable distance from the test point target position prior to engaging the test probe to the test site by the test probe actuator.

The productivity and reliability of the serial probing system can be greatly improved if the gantry settling time is shortened or eliminated. One passive technique of achieving reduced gantry settling time would be to use a dashpot element to dampen-out the vibrations. A disadvantage to using the dashpot element form of vibration control in serial probing systems is that the vibratory motion of the servo-driven gantry moving mass has relatively high amplitude and relatively low frequency such that this passive vibratory motion control technique does not effectively suppress the gantry vibratory motion. Therefore, there is a need to be able to actively control gantry vibratory motion to substantially reduce or eliminate test delays resulting from gantry settling wait periods associated with positioning a moving mass.

SUMMARY OF THE INVENTION

According to the present invention, a vibratory motion compensation apparatus and a vibratory motion compensation method for automatic machine tools and probing systems are provided. A primary positioner moves a gantry to within a predetermined axis distance of a test site of a device under test and a secondary positioner dynamically positions a test probe to maintain the test probe in a substantially fixed position relative to the test site by compensating for gantry overshoot displacements during the gantry settling interval. The dynamic vibratory motion compensation substantially reduces or actually eliminate test delays associated with settling the gantry vibratory motion as the gantry is positioned to the axis position of the test site and significantly increases probing system performance.

A probing system for testing a series of test sites of a device under test comprising a support member, a gantry, a test probe, an axis position sensor, a program, a primary positioner, and a secondary positioner, a secondary axis position sensor is provided. The device under test is held by the support member. The gantry moves along an axis of the device under test. The test probe is mounted to the gantry and is moved along the axis of the device under test with the gantry relative to the series of test sites. The axis position sensor generates an axis error signal corresponding to the position of the gantry along the axis relative to a test site selected from the series of test site. The program generates an axis target signal corresponding to the axis position of the test site. The primary positioner is operatively coupled to the gantry and moves the gantry along the axis to within a predetermined axis distance of the test site responsive to the axis target signal and to the axis error signal. The secondary positioner is operatively coupled to the test probe and compensates for displacement of the test probe from the test site along the axis when the gantry is within the predetermined axis distance of the test site by positioning the test probe to the axis position of the test site responsive to the axis target signal and to the axis error signal. These and other objects and advantages of the present invention shall become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above and the detailed description given below, serve to example the principles of this invention.

DETAILED DESCRIPTION OF THE PREFERRED EMBODIMENT

Figure 1:
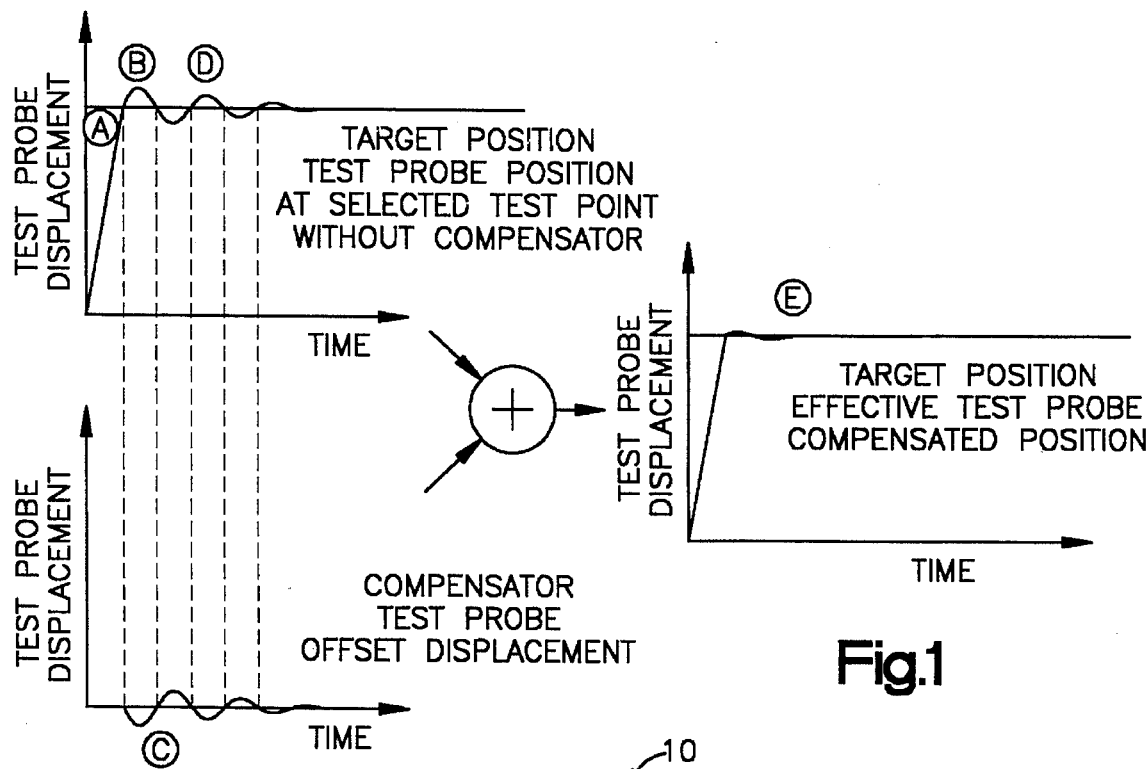
FIG. 1 is a graphical representation illustrating the profile of the compensated test probe position using dynamic vibration compensation.

A high-speed probing system must be fast, highly accurate, and must not damage either the device under test or to the test probe. The probing system test probe actuator must not engage the test probe to the test site until the vibratory motion of the gantry has been settled by the positioning mechanism to within a range that will not result in an unacceptable level of product damage or test probe damage.

A test protocol which executes many successive short moves exhibits a gantry move time which is approximately equal to the gantry settle time. This form of test protocol is frequently the preferred method for testing devices because it utilizes a test measurement scheme that allows the test probe to visit successive test sites in any independent order. This means that each test probe is free to index to the next nearest test site which, from a test throughput perspective, is the optimal test sequence. Where the test measurement interval, the test probe engagement interval, and the test probe disengagement interval are of relatively short duration compared to the gantry positioning time interval, the time required to perform serial test cycles can be substantially reduced and test throughput can be substantially increased if the delays associated with the gantry settling at the target position are either reduced or actually eliminated. Thus, test cycle durations can be reduced by effectively eliminating the affect of gantry settling time delays incurred as the primary positioner attempts to settle the gantry at the target position.

The reduction or actual elimination of the delays associated with the gantry settling at the target position can be achieved by attaching a secondary positioner between the test probe and the gantry. By designing the secondary positioner to be much lighter than the gantry and to operate over a much shorter range than the gantry, the secondary positioner which positions the test probe is able to move and settle with much greater performance than the primary positioner which positions the larger moving mass of the gantry. In operation, once the primary positioner has positioned the gantry to within a predetermined distance of the target position, the secondary positioner moves the test probe in such a way as to dynamically compensate for the gantry overshoot errors which occur as the primary positioner settles the gantry at the target position.

The rate at which a device can be tested by a probing system is in part a function of time required for repositioning the test probe to successive test sites. The test probe repositioning interval is the cumulative time required to move the test probe from one target position to the next successive target position and to settle the gantry so that the test probe can be engaged with the next successive test site of the device under test without causing damage. This invention substantially reduces the test probe repositioning interval by effectively eliminating the test delays associated with settling the gantry at the next successive target position. The reduction in the test probe repositioning interval is achieved by incorporating a secondary positioner into the probing system design which functions to dynamically compensate for, i.e., to reduce or eliminate the effects of, gantry vibratory motion. This reduced test probe repositioning time results in reduced overall test time, improved testing throughput, and improved high-speed probing system performance.

This invention defines the integration of a secondary positioner into a probing system whereby the secondary positioner functions to dynamically compensate for gantry vibratory motion and to increase system performance by substantially eliminating testing delays associated with gantry settling time intervals. The secondary positioner is a low-cost, reliable mechanism useful for increasing high-speed probing system performance by substantially increasing the system test rate. The invention is particularly adaptable to high-speed serial testers which index the test probe through a series of successive short moves. For example, in serial testers it is possible that up to fifty percent of the time required to reposition the gantry to the next test point target position is associated with delays encountered while waiting for gantry vibratory motion to settle to within an acceptable range of the test point target position before engaging the test probe to the selected test site. In applying this invention, after the primary positioner has moved the gantry to within a predetermined distance of the test point target position, the secondary positioner dynamically compensates for the gantry vibratory motion to physically cancel the effect of gantry overshoots such that the test probe is effectively maintained in a substantially fixed position relative to the target position. By dynamically maintaining the test probe at the test point target position substantially free of vibratory motion, this invention allows the test probe tip to be engaged to the selected test site for taking a test measurement without damaging either the device under test or the test probe, and without incurring the time delays associated with the gantry settling intervals, the combination of which is not possible without gantry vibratory motion compensation.

In operation, a primary servo loop functions to control a primary positioner for moving a gantry in either or both of the x-axis and the y-axis to a target position. During transit to the target position, the gantry displacement from the target position is monitored and primary error signals corresponding to either or both the x-axis displacement from the test point target position and the y-axis displacement from the test point target position are generated. The primary x-axis error signal is fed into the primary x-axis servo control loop and the primary y-axis error signal is fed into the primary y-axis servo control loop, both servo control loops being used to command the primary positioner to drive the gantry to the test point target position. The primary x-axis error signal is also used as an input to the secondary x-axis servo control loop, and the primary y-axis error signal is also used as an input to the secondary y-axis servo control loop. During gantry transit to the target position, the test probe displacement from the target position is also monitored and secondary positioner error signals corresponding to either or both the x-axis displacement from the test point target position and the y-axis displacement from the test point target position are generated. The secondary x-axis error signal is fed into the secondary x-axis servo control loop, and the secondary y-axis error signal is fed into the secondary y-axis servo control loop, both servo control loops being used to dynamically compensate for displacements associated with gantry vibratory motion as the primary positioner settles the gantry at the test point target position. The displacement compensation produced by the secondary positioner has the same magnitude but opposite direction of the gantry vibratory motion offset from the test point target position. The secondary positioner servo control loops operate over a bandwidth adequate to ensure that secondary positioner actuators can achieve the fast and accurate performance that is necessary to cancel the gantry vibratory motion offset displacements from the test point target position during the gantry settling interval. Once the test probe is stabilized relative to the test point target position, a test probe actuator engages the test probe to the test site and a test measurement is made. Thus, using this invention, the gantry vibratory motion is dynamically compensated by the secondary positioner, the test probe is effectively maintained in a substantially fixed position relative to the test point target position during the gantry settling interval, the test delays associated with settling the gantry are substantially reduced or actually eliminated, and the overall probing system test throughput is significantly increased. Expressed another way, when the primary positioner moves the gantry within a given distance of the target position, the secondary positioner acquires the target position and holds the test probe at the target position to counteract the effects of the gantry movement as it settles. Thus, the test probe can be engaged to the test site by the test probe actuator and test measurements can begin to be taken without damaging either the device under test or the test probe while the gantry is still moving during the settling interval.

The probing system mechanical design incorporates strong, lightweight materials to provide a rigid assembly while at the same time minimizing the moving mass inertia and the resulting vibratory motion. In the preferred mode, the secondary positioner should operate over a bandwidth adequate to achieve transit accelerations and velocities which are at least four hundred percent the corresponding response rates of the primary positioner. For example, a highly responsive piezo electric actuator can be used to generate the driving forces for the secondary positioner. By implementing dynamic vibratory motion compensation, a test probe actuator can be used to engage the test probe to the test site for taking test measurements immediately after the test probe is positioned within the secondary positioner operating bandwidth at the target position and without waiting for the gantry vibratory motion to decay to a relatively small displacement.

In the preferred mode, the secondary positioner moves the test probe with piezo electric actuators. Piezo electric actuators are particularly useful for this application because they can operate with high accelerations over short distances, they can operate with high velocities over short distances, and they can achieve excellent settling accuracies. To facilitate precision positioning of the test probe during positioning, flexures are used to effectively reduce the structural rigidity of the secondary positioner such that the piezo electric actuators act with sufficient force to generate moments to displace the test probe. The flexures reduce the force necessary to overcome the structural rigidity of the secondary positioner and allow the piezo electric actuators to precisely position the test probe in both a positive and negative direction along the x-axis and in both a positive and negative direction along the y-axis.

The gantry x-axis position is monitored by a primary x-axis position sensor. The primary x-axis position sensor generates a primary x-axis error signal corresponding to the gantry x-axis position as it positioned along the x-axis which is fed back into the primary positioner x-axis servo control loop. The gantry y-axis position is monitored by a primary y-axis position sensor. The primary y-axis position sensor generates a primary y-axis error signal corresponding to the gantry y-axis position as it positioned along the y-axis which is fed back into the primary positioner y-axis servo control loop. The test probe x-axis position is monitored by a secondary x-axis position sensor. The secondary x-axis position sensor generates a secondary x-axis error signal corresponding to the test probe x-axis position as it positioned along the x-axis which is fed back into the secondary positioner x-axis servo control loop. The test probe y-axis position is monitored by a secondary y-axis position sensor. The secondary y-axis position sensor generates a secondary y-axis error signal corresponding to the test probe y-axis position as it is positioned along the y-axis which is fed back into the secondary positioner y-axis servo control loop.

The secondary positioner is designed to be mounted to the gantry and to offset the gantry settling errors along the x-axis and the y-axis immediately after the primary positioner has moved the gantry to within a predetermined x-axis distance and a predetermined y-axis distance of the test point target position. In the preferred mode, the piezo actuators are used to supply the secondary positioner driving force to achieve precision test probe positioning and to substantially reduce test delays associated with the gantry vibratory motion settling interval at each test point target position. By using a smaller, high-performance secondary positioner to offset the gantry vibratory motion which is inherent in a full workspace high-speed probing system, a major increase in probing system performance is realized. Alternatively, the actuators used to perform the secondary positioner function may utilize magnetorestrictive materials or other suitable materials to achieve the desired performance for a given application of this invention, as is known to those skilled in the art.

State of the art high-speed serial probing systems have achieved test rates of ten tests per second using high acceleration, high velocity positioners that provide high performance over a workspace envelope sufficient to probe a variety of product types. By reducing the time required to reposition the test probe to successive target positions, serial probing system test throughput rates can be substantially increased over current state of the art probing systems. Thus, by integrating a secondary positioner with a primary positioner as in the present invention, a high-speed serial probing system is established which operates with substantially improved performance over prior art probing systems which do not employ the dynamic vibratory motion compensation. For example, a state-of-the-art high-speed serial probing system operating without a secondary positioner was demonstrated to make a 200 micron move from a first test point target position to a second test point target position in 40 milliseconds, 15 milliseconds, i.e., 37.5%, of which resulted from the delay associated with settling the gantry vibratory motion. A secondary positioner as provided by this invention can be integrated into this state-of-the-art probing system to dynamically compensate for the gantry vibratory motion, to substantially reduce the 15 millisecond delay associated with settling the gantry, and to significantly increase the overall probing system performance. In the above mentioned state-of-the-art probing system, the test probe actuator was demonstrated to engage the test probe to the test site in 3 milliseconds and to disengage the test probe from the point in 3 milliseconds. It is observed that once the test probe actuator has engaged the test probe to the test site, the interval required to take a test measurement typically requires from 2 milliseconds to 100 milliseconds to complete the test. The secondary positioner of this invention was integrated into the state-of-the-art high-speed serial probing system design and was demonstrated to make the same 200 micron move in 25 milliseconds. Using these interval times, the reduction in overall test time for a given test site which was demonstrated by this invention is calculated in the table below.

| Serial Probing System Test Sequence | Test Cycle Interval Time without Secondary Positioner (milliseconds) | Test Cycle Interval Time with Secondary Positioner (milliseconds) |
| --- | --- | --- |
| Position Test Probe to Test Point Target Position along the X-axis and along the Y-axis (x-axis and y-axis position sensors indicate test probe within +/− 2.5 microns of target position) | 40 | 25 |
| Engage Test Probe to Test Site (test probe position sensor indicates test probe engaged to test site) | 3 | 3 |
| Test Measurement Made (time-out function signals test complete) | 2 | 2 |
| Disengage Test Probe from Test Site | 3 | 3 |
| (test probe position sensor indicates test probe disengaged from test site) | | |
| Total Test Cycle Time | 48 | 33 |

Test probe repositioning using the dynamic vibratory motion compensation taught by this invention substantially reduces the time interval necessary to position the test probe to successive test point target positions. Referring to FIG. 1, the gantry is moved to the test point target position by the primary positioner (Transition A). Immediately after the primary positioner has moved the gantry to within a predetermined distance of the test point target position (Transition B), dynamic vibratory motion compensation is introduced to the test probe (Transition C) which is equal in magnitude but opposite in direction to the gantry positioner overshoot displacement from the test point target position (Transition D). The test probe position is effectively maintained in a substantially fixed position at the test point target position using the dynamic vibratory motion compensation of this invention (Transition E).

Figure 2:
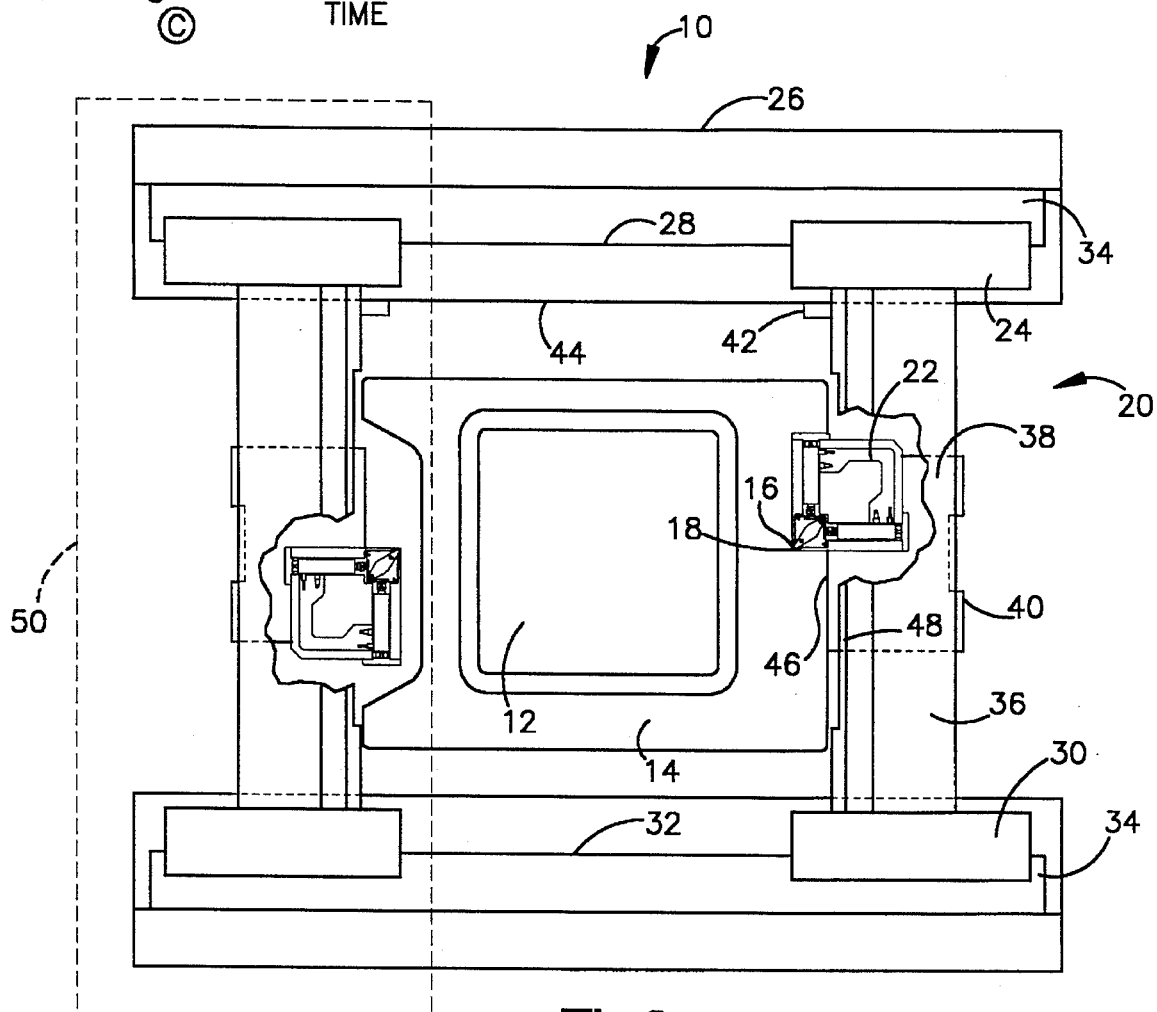
FIG. 2 is a structural plan view diagram somewhat schematic of the improved performance probing system.

Referring to FIG. 2, Probing System 10 facilitates testing Device Under Test (DUT) 12 mounted in Cradle 14 with Test Probe 16 by moving Test Probe Tip 18 into contact with DUT 12 to be tested. Coarse positioning of Test Probe 16 is effected by Primary Positioner 20. Fine positioning of Test Probe 16 is effected by Secondary Positioner 22. To take test measurements at successive test sites, Test Probe Tip 18 is disengaged from a test site where a test has been completed, Test Probe 16 is moved to the next test point target position, and Test Probe Tip 18 is engaged to the test site to take a test measurement. It is to be appreciated that this invention can also be adapted for testing applications which do not require direct physical contact with the test site for taking a test measurement by either eliminating the Test Probe Actuator 68 or by engaging Test Probe Tip 18 with Test Probe Actuator to a location which is suitable for taking a test measurement but which is not in direct physical contact with the test site. It is to be further appreciated that Primary Positioner 20 can be adapted to provide positioning of the gantry in one or more axes using one or more positioning devices.

The first end of Primary Positioner X-axis Slide 24 is operably connected to Base Unit 26 by Slide Rail 28. The first end of Primary Positioner X-axis Slide 30 is operably connected to Base Unit 26 by Slide Rail 32. In the preferred mode, Slide Rails 28, 32 comprise precision ball bearings to permit precise movement of Primary Positioner X-axis Slides 24, 30. Primary Positioner X-axis Slides 24, 30 are positioned along Primary Positioner X-axis Slide Rails 28, 32 by Primary Positioner X-axis Motor 34. In the preferred mode, Primary Positioner X-axis Motor 34 comprises a linear motor which imparts coordinated driving forces to position Primary Positioner X-axis Slide 24 along Primary Positioner X-axis Slide Rail 28 and to position Primary Positioner X-axis Slide 30 along Primary Positioner X-axis Slide Rail 32. Primary Positioner Y-axis Slide Rail 36 is connected to the second end of Primary Positioner X-axis Slide 24 and to the second end of Primary Positioner X-axis Slide 30. Primary Positioner Y-axis Slide 38 is connected to Primary Positioner Y-axis Slide Rail 36. In the preferred mode, Primary Positioner Y-axis Slide Rail 36 comprises precision ball bearings to permit precise movement of Primary Positioner Y-axis Slide 38. Primary Positioner Y-axis Slide 38 is positioned along Primary Positioner Y-axis Slide Rail 36 by Primary Positioner Y-axis Motor 40. In the preferred mode, Primary Positioner Y-axis Motor 40 comprises a linear motor which imparts driving forces to position Primary Positioner Y-axis Slide 38 along Primary Positioner Y-axis Slide Rail 36.

Primary Positioner X-axis Sensor 42 senses Primary Positioner X-axis Encoder Strip 44 and generates a primary x-axis error signal corresponding to the position of Primary Positioner X-axis Slides 24, 30 along the x-axis. Primary Positioner Y-axis Sensor 46 senses Primary Positioner Y-axis Encoder Strip 48 for generating a primary y-axis error signal corresponding to the position of Primary Positioner Y-axis Slide 38 along the y-axis.

Test Probe 16 is operably connected to Secondary Positioner 22. Secondary Positioner 22 provides coordinated fine positioning of Test Probe 16 after Primary Positioner 20 has positioned the gantry within a predetermined distance of the test point target position. Secondary Positioner 22 is operably connected to Primary Positioner 20 through Primary Positioner Y-axis Slide 38 and can be positioned relative to DUT 12 by Primary Positioner 20 and its associated Primary Positioner X-axis Motor 34 and Primary Positioner Y-axis Motor 40.

A high-speed serial probing system can be configured with either a single probing system or with two or more probing systems. Thus, a high-speed serial probing system can be configured with a single probing system, i.e., configured with Probing System 10. Alternatively, a high-speed serial probing system can be configured with two probing systems operating in conjunction with one another, i.e., configured with Probing System 10 operating in conjunction with Probing System 50. In this latter case, Probing System 50 can be used in series with Probing System 10 for testing selected test sites of DUT 12 which require two test probes to complete the test measurement, or Probing System 50 can be used in parallel with Probing System 10 for performing tests other than those performed by Probing System 10 to increase device testing throughput. It is to be appreciated that multiple probing systems using the methods and apparatus of this invention can be integrated into a probing system array to achieve enhanced testing capabilities and enhanced testing productivity.

Figure 3:
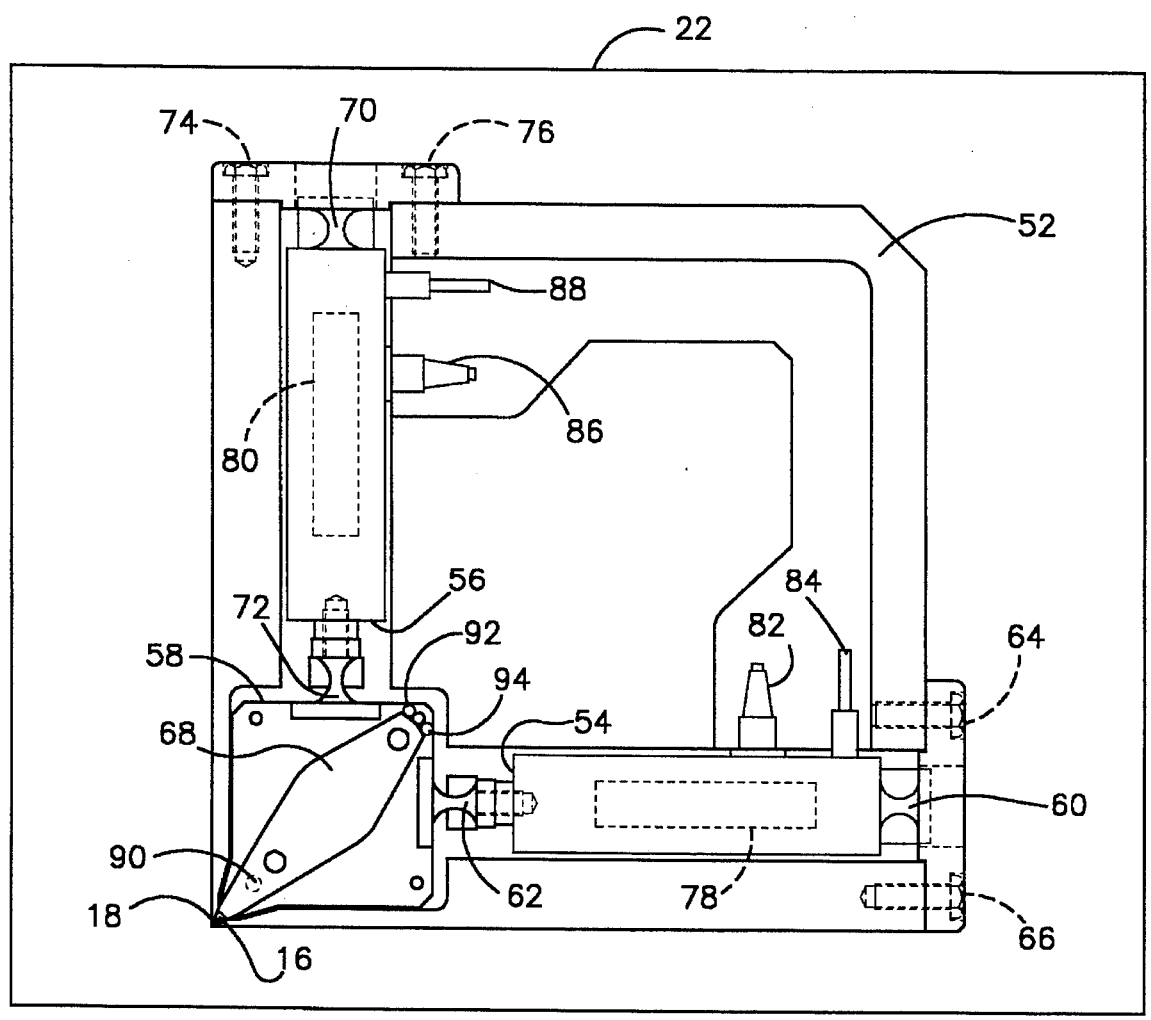
FIG. 3 is a structural diagram somewhat schematic of the secondary positioner.

Secondary Positioner 22 introduces compensation forces to Test Probe 16 to dynamically offset the gantry vibratory motion which occurs while positioning the gantry to successive test point target positions, as illustrated in FIG. 1. Referring now to FIG. 3, Secondary Positioner Housing 52 supports Secondary Positioner X-axis Motor 54, Secondary Positioner Y-axis Motor 56, and Test Probe Engagement Module 58. Secondary Positioner X-axis Motor 54 is connected at the first end to Secondary Positioner Housing 52 by Flexure 60 and at the second end to Test Probe Engagement Module 58 by Flexure 62. In the preferred mode, Secondary Positioner X-axis Motor 54 is a piezo electric actuator which produces high acceleration, transits with high velocity, and settles quickly. Flexures 60, 62 function to reduce structural rigidity of Secondary Positioner 22 in the y-axis to allow precision positioning of Test Probe 16 in both directions along the y-axis. Secondary Positioner Y-axis Motor 56 is connected at the first end to Secondary Positioner Housing 52 by Flexure 70 and at the second end to Test Probe Engagement Module 58 by Flexure 72. In the preferred mode, Secondary Positioner Y-axis Motor 56 is a piezo electric actuator which produces high acceleration, transits at high velocity, settles quickly. Flexures 70, 72 function to reduce structural rigidity of Secondary Positioner 22 in the x-axis to allow precision positioning of Test Probe 16 in both directions along the x-axis.

The x-axis position of Test Probe 16 is sensed by Secondary Positioner X-axis Sensor 78. The y-axis position of Test Probe 16 is sensed by Secondary Positioner Y-axis Sensor 80. In the preferred mode, Secondary Positioner X-axis Sensor 78 and Secondary Positioner Y-axis Sensor 80 comprise strain gauges. It is to be appreciated that other types of position sensors can be used to sense the x-axis and y-axis position of Test Probe 16, e.g., optical sensors, electromagnetic sensors, radio frequency sensors, or other suitable sensors depending on the probing system application.

Secondary Positioner X-axis Motor 54 control signals are received through Connector 82 and Secondary Positioner X-axis Sensor signals are transmitted through Connector 84. Secondary Positioner Y-axis Motor 56 control signals are received through Connector 86 and Secondary Positioner Y-axis Sensor signals are transmitted through Connector 88. Once Primary Positioner 20 and Secondary Positioner 22 have positioned Test Probe 16 relative to the test point target position such that no collision damage is likely to occur to either DUT 12 or Test Probe 16 or Test Probe Tip 18, the Test Probe Actuator 68 engages Test Probe Tip 18 to the selected test site along any axis. In the preferred mode, Test Probe Actuator 68 must be highly responsive, fast, and accurate. Test Probe Position Sensor 90 senses the position of Test Probe 16 and Test Probe Tip 18 and generates a position signal which is used for controlling when test measurements are made and when movements are made. In the preferred mode, Test Probe Position Sensor 90 comprises either a linear voltage differential transformer or a photo diode. It is to be appreciated that other types of position sensors can be used to sense the position of Test Probe 16 and Test Probe Tip 18. Upon completing the test measurement, Test Probe Actuator 68 disengages Test Probe Tip 18 from the selected test site. Test Probe Actuator 68 control signals are received through Connector 92. Test Probe 16 and Test Probe Tip 18 position signals generated by Test Probe Position Sensor 90 are transmitted through Connector 94.

It is to be appreciated that this invention can be integrated into probing system designs which utilize testing methods that do not require direct physical contact of the test probe tip with the test site. It is to be further appreciated that this invention can be integrated into probing system designs which do not require the test probe tip to be engaged to the test site along any axis and to be disengaged from the test site along any axis. It is to be still further appreciated that this invention is not limited to probing systems and can be incorporated into other types of automatic machine tools.

Figure 4:
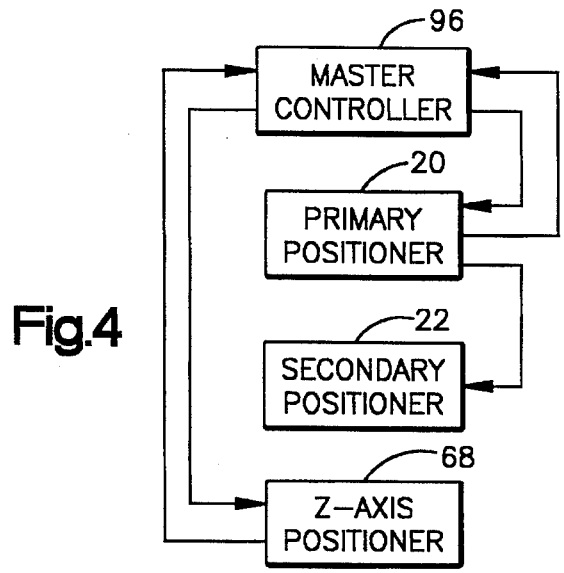
FIG. 4 is block diagram of the improved performance probing system control system.

Referring now to FIG. 4, Master Controller 96 uses a program to generate command signals which are used for controlling movement of Primary Positioner 20, Secondary Positioner 22, and Test Probe Actuator 68 for testing successive test points of DUT 12. Master Controller 96 controls movement of Primary Positioner 20 and Secondary Positioner 22 along the x-axis by generating a command signal, $X_r$, to drive Primary Positioner X-axis Motor 34 and Secondary Positioner X-axis Motor 54. Master Controller 96 controls movement of Primary Positioner 20 and Secondary Positioner 22 along the y-axis by generating a command signal, $Y_r$, to drive Primary Positioner Y-axis Motor 40 and Secondary Positioner Y-axis Motor 56. Primary Positioner X-axis Sensor 42 senses Primary Positioner X-axis Encoder Strip 44 and generates a primary x-axis error signal corresponding to the position of Primary Positioner X-axis Slides 24, 30 along the x-axis. The primary x-axis error signal is used by Master Controller 96 to drive Primary Positioner X-axis Motor 34 and to drive Secondary Positioner X-axis Motor 54. Primary Positioner Y-axis Sensor 46 senses Primary Positioner Y-axis Encoder Strip 48 and generates a primary y-axis error signal corresponding to the position of Primary Positioner Y-axis Slide 38 along the y-axis. The primary y-axis error signal is used by Master Controller 96 to drive Primary Y-axis Positioner Motor 40 and to drive Secondary Positioner Y-axis Motor 56. Master Controller 96 controls movement of Test Probe 16 by generating a command signal to drive Test Probe Actuator 68 for engaging Test Probe Tip 18 to the selected test site to take the test measurement and for disengaging Test Probe Tip 18 from the selected test site upon completion of the test measurement. Master Controller 96 also receives a test probe position signal from Test Probe Position Sensor 90 which is used for controlling when test measurements are made and when movements are made.

Control of Primary Positioner 20 is facilitated using a primary servo control loop for x-axis positioning and a primary servo control loop for y-axis positioning. Control of Secondary Positioner 22 is facilitated using a secondary servo control loop for x-axis positioning and a secondary servo control loop for y-axis positioning. It is to be appreciated that this invention also contemplates controlling the primary positioner in one or more axes and controlling the secondary positioner in one or more axes. Thus, this invention contemplates both single axis dynamic vibratory motion compensation using a primary servo control loop and a secondary servo control loop to control positioning in a single axis, and dual axis dynamic vibratory motion compensation using a primary x-axis servo control loop and a secondary x-axis servo control loop to control positioning in the x-axis and using a primary y-axis servo control loop and a secondary y-axis servo control loop to control positioning in the y-axis. It is to be further appreciated this invention can be operated totally closed loop such that each primary servo control loop is operating closed loop, i.e., each primary servo control loop uses positional feedback derived from the primary positioning system, and such that each secondary servo control loop is operating closed loop, i.e., each secondary servo control loop uses positional feedback derived from the secondary positioning system. It is to be still further appreciated that this invention can be operated partially closed loop and partially open loop such that one or more primary servo control loops is operating closed loop, i.e., one or more primary servo control loops uses positional feedback derived from the primary positioning system, and such that one or more secondary servo control loops is operating open loop, i.e., one or more secondary servo control loop uses positional feedback derived from the primary positioning system.

Figure 5:
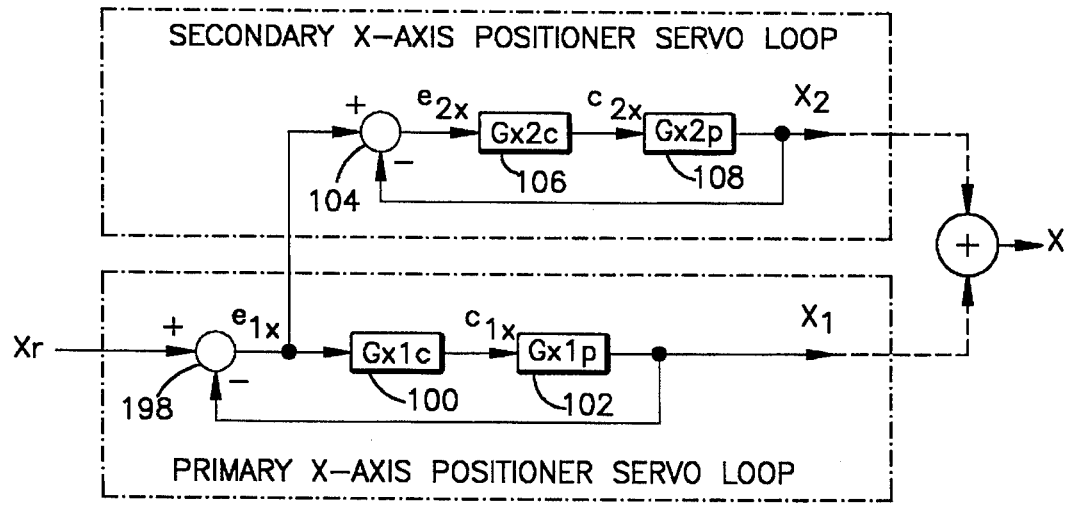
FIG. 5 is a control diagram of the primary x-axis servo loop and the secondary x-axis servo loop.

Functional control block names and functional signal names for primary x-axis positioning and for secondary x-axis positioning are shown in FIG. 5. For primary positioning along the x-axis, a desired position, $X_r$, is fed into Primary X-axis Servo Circuit 98. A primary x-axis error signal, $e_{1x}$, is generated by Primary X-axis Servo Circuit 98 from the difference between the desired x-axis position, $X_r$, and the present position of the Primary Positioner X-axis Slides 28, 32 along the x-axis, $X_1$. The primary x-axis error signal $e_{1x}$ is fed into Primary X-axis Position Controller Circuit ($G_{x1C}$) 100 of Master Controller 96 to generate a command signal, $C_{1X}$. Command signal $C_{1X}$ is then fed into Primary Positioner X-axis Motor Circuit ($G_{x1P}$) 102 of Primary Positioner 20 to command Primary X-axis Motor 34 to move Primary Positioner X-axis Slides 24, 30 to displacement $X_1$. For secondary positioning along the x-axis, the primary x-axis error signal $e_{1x}$ is fed into Secondary X-axis Servo Circuit 104. A secondary x-axis error signal, $e_{2x}$, is generated by Secondary X-axis Servo Circuit 104 from the difference between the primary x-axis error signal, $e_{1x}$, and the present position of Test Probe 16 along the x-axis, $X_2$. The secondary x-axis error signal $e_{2x}$ is fed into Secondary X-axis Position Controller ($G_{x2C}$) 106 of Secondary Positioner 22 to generate a command signal, $C_{2X}$. Command Signal $C_{2X}$ is then fed into Secondary Positioner X-axis Motor Circuit ($G_{x2P}$) 108 of Secondary Positioner 22 to command Secondary X-axis Motor 54 to produce a displacement, $X_2$, which has the same magnitude but opposite direction as $X_1$ and which compensates for the vibratory motion encountered as the gantry settles about the test point target position. The effective position of Test Probe 16 along the x-axis, X, is the sum of displacement $X_1$ and displacement $X_2$, as shown in FIG. 5.

Figure 6:
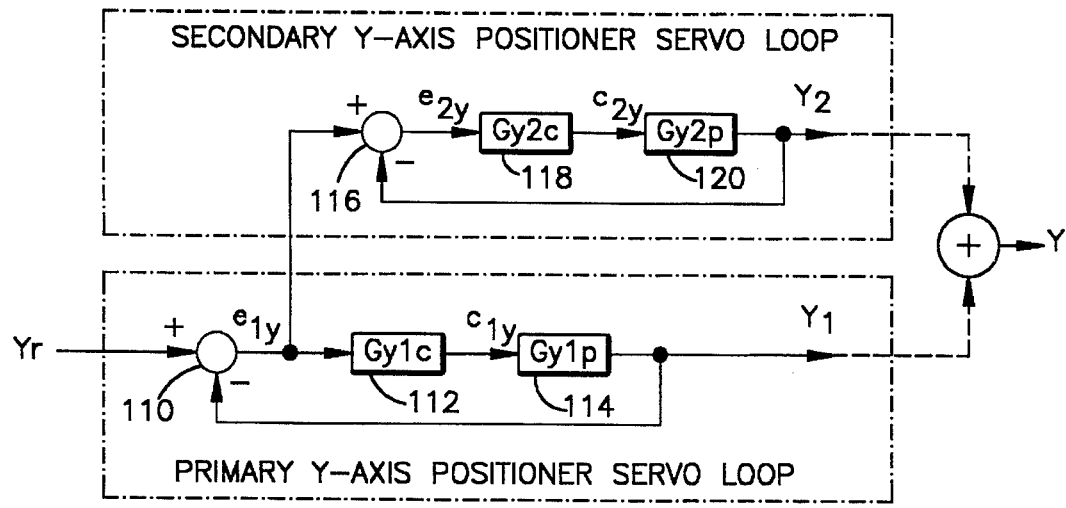
FIG. 6 is a control diagram of the primary y-axis servo loop and the secondary y-axis servo loop.

Functional control block names and functional signal names for primary y-axis positioning and for secondary y-axis positioning are shown in FIG. 6. For primary positioning along the y-axis, a desired position, $Y_r$, is fed into Primary Y-axis Servo Circuit 110. A primary y-axis error signal, $e_{1Y}$, is generated by Primary Y-axis Servo Circuit 110 from the difference between the desired y-axis position, $Y_r$, and the present position of the Primary Positioner Y-axis Slide 38 along the y-axis, $Y_1$. The primary y-axis error signal $e_{1Y}$ is fed into Primary Y-axis Position Controller Circuit ($G_{Y1C}$) 112 of Master Controller 96 to generate a command signal, $C_{1Y}$. Command signal $C_{1Y}$ is then fed into Primary Positioner Y-axis Motor Circuit ($G_{Y1P}$) 114 of Primary Positioner 20 to command Primary Y-axis Motor 40 to move Primary Positioner Y-axis Slide 38 to displacement $Y_1$. For secondary positioning along the y-axis, the primary y-axis error signal $e_{1Y}$ is fed into Secondary Y-axis Servo Circuit 116. A secondary y-axis error signal, $e_{2Y}$, is generated by Secondary Y-axis Servo Circuit 116 from the difference between the primary y-axis error signal, $e_{1Y}$, and the present position of Test Probe 16 along the y-axis, $Y_2$. The secondary y-axis error signal $e_{2Y}$ is fed into Secondary Y-axis Position Controller ($G_{Y2C}$) 118 of Secondary Positioner 22 to generate a command signal, $C_{2Y}$. Command Signal $C_{2Y}$ is then fed into Secondary Positioner Y-axis Motor Circuit ($G_{Y2P}$) 120 of Secondary Positioner 22 to command Secondary Y-axis Motor 56 to produce a displacement, $Y_2$, which has the same magnitude but opposite direction as $Y_1$ and which compensates for the vibratory motion encountered as the gantry settles about the test point target position. The effective position of Test Probe 16 along the y-axis, Y, is the sum of displacement $Y_1$ and displacement $Y_2$, as shown in FIG. 6.

In a manner well known in the art, Master Controller 96 uses a software driven application program to operate Primary Positioner 20, Secondary Positioner 22, and Test Probe Engagement Module 58. The software coordinates the test point target positioning sequence and timing to locate the test probe and to acquire the necessary test measurements. The software conducts the test process by reading test instructions from a file. Low-level program functions provide communications of Primary Positioner 20 movement commands to Primary Positioner X-axis Motor 34 and to Primary Positioner Y-axis Motor 40, Secondary Positioner 22 movement commands to the Secondary X-axis Motor 54 and Secondary Y-axis Motor 56, and Test Probe Engagement Module 58 movement commands to Test Probe Actuator 68. In addition, low-level program functions obtain position sensing information from Primary Positioner X-axis Sensor 42, Primary Positioner Y-axis Sensor 46, Secondary Positioner X-axis Sensor 78, Secondary Positioner Y-axis Sensor 80, and Test Probe Position Sensor 90 to monitor the start, the transit, and the finish of each of the positioning movements. A software loop reads the test instructions from a file, determines the required motions to move to successive test points target positions, including those motions necessary to avoid collisions, and generates command signals to carry out the required sequences of motion. In a manner well known in the art, the settling motion of the gantry about the test point target position is sensed by Primary Positioner X-axis Sensor 42 and Primary Positioner Y-axis Sensor and Test Probe Actuator 68 will not command Test Probe Tip 18 to engage the selected test site until a software driven controller program determines that Test Probe 16 has been positioned within a predetermined x-axis distance of the test point target position, Test Probe 16 has been positioned within a predetermined y-axis distance of the test point target position, Test Probe 16 velocity along the x-axis is such that gantry overshoot along the x-axis can be maintained within the predetermined x-axis distance, and Test Probe 16 velocity along the y-axis is such that gantry overshoot along the y-axis can be maintained within the predetermined y-axis distance. As applied in this invention, the controller program is modified with the inclusion of Secondary Positioner 22 such that the predetermined x-axis distance from the test point target position, the predetermined y-axis distance from the test point target position, Test Probe 16 velocity along the x-axis, and Test Probe 16 velocity along the y-axis are relaxed since Secondary Positioner 22 dynamically offsets the vibratory motion. This controller program modification reduces the program execution time necessary for the software loop to sequence each test cycle, reduces the overall test time, and results in the improved probing system performance.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, the secondary positioner dynamic vibratory motion compensation apparatus and method of this invention can be used for single axis positioning for a high-speed serial probing system employing a test probe tip, a cluster probing system employing a test probe head, and an automatic machine tool system requiring high-speed precision positioning of a tool relative to a workpiece. Similarly, the secondary positioner dynamic vibratory motion compensation apparatus and method of this invention can be used for dual axis positioning of test probe tips, test probe heads, and tools for serial probing systems, cluster probing systems, and automatic machine tools, respectively. In addition, the secondary positioner dynamic vibratory motion compensation apparatus and method of this invention can be used to position a test probe for taking a measurement of a test site without the test probe tip making direct physical contact with the test site for testing applications employing optical, ultrasonic, electromagnetic, radio frequency, or other testing techniques which do not require direct physical contact with the test probe for taking a test measurement. As a result of the large inertias associated with moving mass systems which produce high accelerations and high transit velocities, it is the nature of automatic machine tools employing such massive positioning structure to require a long time to settle the gantry vibratory motion to within a range where test measurements can be accurately taken and where collision damage between the probing system and the device under test does not occur. Thus, this invention can be used to improve the performance of any automatic machine tool system which produces vibratory motion on the gantry. This invention offers a solution to improve the performance and the productivity of automatic machine tool systems by reducing delays associated with settling a moving mass about a target position prior to performing a task with a work piece or prior to taking a test measurement from a test site. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. A probing system for testing a series of test sites of a device under test, comprising:
   (a) a support member, said support member being configured to hold the device under test;
   (b) a gantry, said gantry being configured for movement along an axis of the device under test;
   (c) a test probe, said test probe being mounted to said gantry for coordinated movement with said gantry along the axis relative to the series of test sites;
   (d) a primary positioner, said primary positioner being operatively coupled to said gantry, and being configured to move said gantry along the axis to within a predetermined axis distance of a test site selected from the series of test sites responsive to (i) an axis target signal corresponding to the axis position of said test site and (ii) an axis error signal corresponding to the position of said gantry along the axis relative to said test site; and
   (e) a secondary positioner, said secondary positioner being operatively coupled to said test probe, and being configured to compensate for displacement of said test probe from said test site along the axis when said gantry is within said predetermined axis distance of said test site by positioning said test probe to the axis position of said test site responsive to (i) said axis target signal and (ii) said axis error signal.

2. The probing system for testing a series of test sites of a device under test as defined by claim 1, further comprising a test probe actuator, said test probe actuator being operatively coupled to said test probe, and being configured to engage said test probe to said test site for testing said device under test and to disengage said test probe from said test site upon completion of the testing.

3. The probing system for testing a series of test sites of a device under test as defined by claim 1, wherein said secondary positioner comprises a piezo actuator.

4. The probing system for testing a series of test sites of a device under test as defined by claim 1, further comprising a test probe actuator, said test probe actuator being operatively coupled to said test probe, and being configured to engage said test probe to said test site for testing said device under test and to disengage said test probe from said test site upon completion of the testing, and wherein:
   (a) said axis target signal is generated by a program, said program being controlled by a programmable controller;
   (b) said axis error signal is generated by an axis position sensor; and
   (c) said test probe comprises a test probe head for cluster testing the series of test sites of the device under test.

5. The probing system for testing a series of test sites of a device under test as defined by claim 1, wherein:
   (a) said axis target signal is generated by a program, said program being controlled by a programmable controller;
   (b) said axis error signal is generated by an axis position sensor; and
   (c) said test probe comprises a test probe tip for serial testing the series of test sites of the device under test.

6. The probing system for testing a series of test sites of a device under test as defined by claim 5, further comprising a test probe actuator, said test probe actuator being operatively coupled to said test probe, and being configured to engage said test probe to said test site for testing said device under test and to disengage said test probe from said test site upon completion of the testing.

7. A probing system for testing a series of test sites of a device under test, comprising:
   (a) a support member, said support member being configured to hold the device under test;
   (b) a gantry, said gantry being configured for movement along x and y axes of the device under test;
   (c) a test probe, said test probe being mounted to said gantry for coordinated movement with said gantry along x and y axes relative to the series of test sites;
   (d) a primary positioner, said primary positioner being operatively coupled to said gantry, and being configured to move said gantry along the x-axis to within a predetermined x-axis distance of a test site selected from the series of test sites and along the y-axis to within a predetermined y-axis distance of said test site, including:
      (1) a primary x-axis positioning device, said primary x-axis positioning device being operatively coupled to said gantry, and being configured to position said gantry along the x-axis to within said predetermined x-axis distance of said test site responsive to (i) an x-axis target signal corresponding to the x-axis position of said test site and (ii) an x-axis error signal corresponding to the position of said gantry along the x-axis relative to said test site; and
      (2) a primary y-axis positioning device, said primary y-axis positioning device being operatively coupled to said gantry, and being configured to position said gantry along the y-axis to within said predetermined y-axis distance of said test site responsive to (i) a y-axis target signal corresponding to the y-axis position of said test site and (ii) a y-axis error signal corresponding to the position of said gantry along the y-axis relative to said test site; and
   (e) a secondary positioner, said secondary positioner being operatively coupled to said test probe, and being configured to move said test probe along the x-axis to position said test probe to the x-axis position of said test site and to move said test probe along the y-axis to position said test probe to the y-axis position of said test site, including:
      (1) a secondary x-axis positioning device, said secondary x-axis positioning device being operatively coupled to said test probe, and being configured to compensate for displacement of said test probe from said test site along the x-axis when said gantry is within said predetermined x-axis distance of said test site by positioning said test probe to the x-axis position of said test site responsive to (i) said x-axis target signal and (ii) said x-axis error signal; and
      (2) a secondary y-axis positioning device, said secondary y-axis positioning device being operatively coupled to said test probe, and being configured to compensate for displacement of said test probe from said test site along the y-axis when said gantry is within said predetermined y-axis distance of said test site by positioning said test probe to the y-axis position of said test site responsive to (i) said y-axis target signal and (ii) said y-axis error signal.

8. The probing system for testing a series of test sites of a device under test as defined by claim 7, further comprising a test probe actuator, said test probe actuator being operatively coupled to said test probe, and being configured to engage said test probe to said test site for testing said device under test and to disengage said test probe from said test site upon completion of the testing.

9. The probing system for testing a series of test sites of a device under test as defined by claim 7, wherein said secondary x-axis positioning device comprises a piezo actuator, and wherein said secondary y-axis positioning device comprises a piezo actuator.

10. The probing system for testing a series of test sites of a device under test as defined by claim 7, wherein:
    (a) said x-axis target signal and said y-axis target signal are generated by a program, said program being controlled by a programmable controller;
    (b) said x-axis error signal is generated by an x-axis sensor and said y-axis error signal is generated by a y-axis sensor; and
    (c) said test probe comprises a test probe head for cluster testing the series of test sites of the device under test.

11. The probing system for testing a series of test sites of a device under test as defined by claim 7, wherein:
    (a) said x-axis target signal and said y-axis target signal are generated by a program, said program being controlled by a programmable controller;
    (b) said x-axis error signal is generated by an x-axis sensor and said y-axis error signal is generated by a y-axis sensor; and
    (c) said test probe comprises a test probe tip for serial testing the series of test sites of the device under test.

12. The probing system for testing a series of test sites of a device under test as defined by claim 11, further comprising a test probe actuator, said test probe actuator being operatively coupled to said test probe, and being configured to engage said test probe to said test site for testing said device under test and to disengage said test probe from said test site upon completion of the testing.

13. A probing system for testing a series of test sites of a device under test, comprising:
    (a) a support member, said support member being configured to hold the device under test;
    (b) a gantry, said gantry being configured for movement along an axis of the device under test;
    (c) a test probe, said test probe being mounted to said gantry for coordinated movement with said gantry along the axis relative to the series of test sites;
    (d) a primary positioner, said primary positioner being operatively coupled to said gantry, and being configured to move said gantry along the axis to within a predetermined axis distance of a test site selected from the series of test sites responsive to (i) an axis target signal corresponding to the axis position of said test site and (ii) a primary axis error signal corresponding to the position of said gantry along the axis relative to said test site; and
    (e) a secondary positioner, said secondary positioner being operatively coupled to said test probe, and being configured to compensate for displacement of said test probe from said test site along the axis when said gantry is within said predetermined axis distance of said test site by positioning said test probe to the axis position of said test site responsive to (i) said axis target signal and (ii) said primary axis error signal and (iii) a secondary axis error signal corresponding to the position of said test probe along the axis relative to said test site.

14. The probing system for testing a series of test sites of a device under test as defined by claim 13, further comprising a test probe actuator, said test probe actuator being operatively coupled to said test probe, and being configured to engage said test probe to said test site for testing said device under test and to disengage said test probe from said test site upon completion of the testing.

15. The probing system for testing a series of test sites of a device under test as defined by claim 13, wherein said secondary positioner comprises a piezo actuator.

16. The probing system for testing a series of test sites of a device under test as defined by claim 13, further comprising a test probe actuator, said test probe actuator being operatively coupled to said test probe, and being configured to engage said test probe to said test site for testing said device under test and to disengage said test probe from said test site upon completion of the testing, and wherein:
    (a) said axis target signal is generated by a program, said program being controlled by a programmable controller;
    (b) said primary axis error signal is generated by a primary axis position sensor;
    (c) said secondary axis error signal is generated by a secondary axis position sensor; and
    (d) said test probe comprises a test probe head for cluster testing the series of test sites of the device under test.

17. The probing system for testing a series of test sites of a device under test as defined by claim 13, wherein:
    (a) said axis target signal is generated by a program, said program being controlled by a programmable controller;
    (b) said primary axis error signal is generated by a primary axis position sensor;
    (c) said secondary axis error signal is generated by a secondary axis position sensor; and
    (d) said test probe comprises a test probe tip for serial testing the series of test sites of the device under test.

18. The probing system for testing a series of test sites of a device under test as defined by claim 17, further comprising a test probe actuator, said test probe actuator being operatively coupled to said test probe, and being configured to engage said test probe to said test site for testing said device under test and to disengage said test probe from said test site upon completion of the testing.

19. A probing system for testing a series of test sites of a device under test, comprising:
    (a) a support member, said support member being configured to hold the device under test;
    (b) a gantry, said gantry being configured for movement along x and y axes of the device under test;
    (c) a test probe, said test probe being mounted to said gantry for coordinated movement with said gantry along x and y axes relative to the series of test sites;
    (d) a primary positioner, said primary positioner being operatively coupled to said gantry, and being configured to move said gantry along the x-axis to within a predetermined x-axis distance of a test site selected from the series of test sites and along the y-axis to within a predetermined y-axis distance of said test site, including:
        (1) a primary x-axis positioning device, said primary x-axis positioning device being operatively coupled to said gantry, and being configured to position said gantry along the x-axis to within said predetermined x-axis distance of said test site responsive to (i) an x-axis target signal corresponding to the x-axis position of said test site and (ii) a primary x-axis error signal corresponding to the position of said gantry along the x-axis relative to said test site; and (2) a primary y-axis positioning device, said primary y-axis positioning device being operatively coupled to said gantry, and being configured to position said gantry along the y-axis to within said predetermined y-axis distance of said test site responsive to (i) a y-axis target signal corresponding to the y-axis position of said test site and (ii) a primary y-axis error signal corresponding to the position of said gantry along the y-axis relative to said test site; and (e) a secondary positioner, said secondary positioner being operatively coupled to said test probe, and being configured to move said test probe along the x-axis to position said test probe to the x-axis position of said test site and to move said test probe along the y-axis to position said test probe to the y-axis position of said test site, including:

(1) a secondary x-axis positioning device, said secondary x-axis positioning device being operatively coupled to said test probe, and being configured to compensate for displacement of said test probe from said test site along the x-axis when said gantry is within said predetermined x-axis distance of said test site by positioning said test probe to the x-axis position of said test site responsive to (i) said x-axis target signal and (ii) said primary x-axis error signal and (iii) a secondary x-axis error signal corresponding to the position of said test probe along the x-axis relative to said test site; and (2) a secondary y-axis positioning device, said secondary y-axis positioning device being operatively coupled to said test probe, and being configured to compensate for displacement of said test probe from said test site along the y-axis when said gantry is within said predetermined y-axis distance of said test site by positioning said test probe to the y-axis position of said test site responsive to (i) said y-axis target signal and (ii) said primary y-axis error signal and (iii) a secondary y-axis error signal corresponding to the position of said test probe along the y-axis relative to said test site.

20. The probing system for testing a series of test sites of a device under test as defined by claim 19, further comprising a test probe actuator, said test probe actuator being operatively coupled to said test probe, and being configured to engage said test probe to said test site for testing said device under test and to disengage said test probe from said test site upon completion of the testing.

21. The probing system for testing a series of test sites of a device under test as defined by claim 19, wherein said secondary x-axis positioning device comprises a piezo actuator, and wherein said secondary y-axis positioning device comprises a piezo actuator.

22. The probing system for testing a series of test sites of a device under test as defined by claim 19, further comprising a test probe actuator, said test probe actuator being operatively coupled to said test probe, and being configured to engage said test probe to said test site for testing said device under test and to disengage said test probe from said test site upon completion of the testing, and wherein:

(a) said x-axis target signal and said y-axis target signal are generated by a program, said program being controlled by a programmable controller;

(b) said primary x-axis error signal is generated by a primary x-axis position sensor and said primary y-axis error signal is generated by a primary y-axis position sensor;

(c) said secondary x-axis error signal is generated by a secondary axis position sensor and said secondary y-axis error signal is generated by a secondary y-axis position sensor; and (d) said test probe comprises a test probe head for cluster testing the series of test sites of the device under test.

23. The probing system for testing a series of test sites of a device under test as defined by claim 19, wherein:

(a) said x-axis target signal and said y-axis target signal are generated by a program, said program being controlled by a programmable controller;

(b) said primary x-axis error signal is generated by a primary x-axis position sensor and said primary y-axis error signal is generated by a primary y-axis position sensor;

(c) said secondary x-axis error signal is generated by a secondary axis position sensor and said secondary y-axis error signal is generated by a secondary y-axis position sensor; and (d) said test probe comprises a test probe tip for serial testing the series of test sites of the device under test.

24. The probing system for testing a series of test sites of a device under test as defined by claim 23, further comprising a test probe actuator, said test probe actuator being operatively coupled to said test probe, and being configured to engage said test probe to said test site for testing said device under test and to disengage said test probe from said test site upon completion of the testing.

25. A method of probing a series of test sites points of a device under test, comprising the steps of:

(a) generating an axis target signal corresponding to the position of a test site selected from the series of test sites along an axis of the device under test;

(b) generating an axis error signal corresponding to the position of a gantry along the axis relative to said test site;

(c) moving said gantry along the axis to within a predetermined axis distance of said test site responsive to (i) said axis target signal and (ii) said axis error signal; and (d) moving a test probe mounted on said gantry along the axis to compensate for displacement of said test probe from said test site along the axis when said gantry is within said predetermined axis distance of said test site by positioning said test probe to the axis position of said test site responsive to (i) said axis target signal and (ii) said axis error signal.

26. The method of probing a series of test sites of a device under test as defined by claim 25, further comprising the steps of:

(a) engaging said test probe to said test site for testing said device under test; and (b) disengaging said test probe from said test site upon completion of the testing.

27. A method of probing a series of test sites of a device under test, comprising the steps of:

(a) generating an x-axis target signal corresponding to position of a test site selected from the series of test sites along the x-axis of the device under test;

(b) generating a y-axis target signal corresponding to the y-axis position of said test site along the y-axis of the device under test;

(c) generating an x-axis error signal corresponding to the position of a gantry along the x-axis relative to said test site;

(d) generating a y-axis error signal corresponding to the position of said gantry along the y-axis relative to said test site;

(e) moving said gantry along the x-axis to within a predetermined x-axis distance of said test site responsive to (i) said x-axis target signal and (ii) said x-axis error signal;

(f) moving said gantry along the y-axis to within a predetermined y-axis distance of said test site responsive to (i) said y-axis target signal and (ii) said y-axis error signal;

(g) moving a test probe mounted on said gantry along the x-axis to compensate for displacement of said test probe from said test site along the x-axis when said gantry is within said predetermined x-axis distance of said test site by positioning said test probe to the x-axis position of said test site responsive to (i) said x-axis target signal and (ii) said x-axis error signal; and (h) moving said test probe along the y-axis to compensate for displacement of said test probe from said test site along the y-axis when said gantry is within said predetermined y-axis distance of said test site by positioning said test probe to the y-axis position of said test site responsive to (i) said y-axis target signal and (ii) said y-axis error signal.

28. The method of probing a series of test sites of a device under test as defined by claim 27, further comprising the steps of:

(a) engaging said test probe to the said test site for testing said device under test; and (b) disengaging said test probe from said test site upon completion of the testing.

29. A method of probing a series of test sites points of a device under test, comprising the steps of:

(a) generating an axis target signal corresponding to the position of a test site selected from the series of test sites along an axis of the device under test;

(b) generating a primary axis error signal corresponding to the position of a gantry along the axis relative to said test site;

(c) moving said gantry along the axis to within a predetermined axis distance of said test site responsive to (i) said axis target signal and (ii) said primary axis error signal;

(d) generating a secondary axis error signal corresponding to the position of a test probe along the axis relative to said test site; and (e) moving a test probe mounted on said gantry along the axis to compensate for displacement of said test probe from said test site along the axis when said gantry is within said predetermined axis distance of said test site by positioning said test probe to the axis position of said test site responsive to (i) said axis target signal and (ii) said primary axis error signal and (iii) said secondary axis error signal.

30. The method of probing a series of test sites of a device under test as defined by claim 29, further comprising the steps of:

(a) engaging said test probe to said test site for testing said device under test; and (b) disengaging said test probe from said test site upon completion of the testing.

31. A method of probing a series of test sites of a device under test, comprising the steps of:

(a) generating an x-axis target signal corresponding to the position of a test site selected from the series of test sites along the x-axis of the device under test;

(b) generating a y-axis target signal corresponding to the position of said test site along the y-axis of the device under test;

(c) generating a primary x-axis error signal corresponding to the position of a gantry along the x-axis relative to said test site;

(d) generating a primary y-axis error signal corresponding to the position of said gantry along the y-axis relative to said test site;

(e) moving said gantry along the x-axis to within a predetermined x-axis distance of said test site responsive to (i) said x-axis target signal and (ii) said primary x-axis error signal;

(f) moving said gantry along the y-axis to within a predetermined y-axis distance of said test site responsive to (i) said y-axis target signal and (ii) said primary y-axis error signal;

(g) generating a secondary x-axis error signal corresponding to the position of a test probe along the x-axis relative to said test site;

(h) generating a secondary y-axis error signal corresponding to the position of said test probe along the y-axis relative to said test site;

(i) moving said test probe along the x-axis to compensate for displacement of said test probe from said test site along the x-axis when said gantry is within said predetermined x-axis distance of said test site by positioning said test probe to the x-axis position of said test site responsive to (i) said x-axis target signal and (ii) said primary x-axis error signal and (iii) said secondary x-axis error signal; and (j) moving said test probe along the y-axis to compensate for displacement of said test probe from said test site along the y-axis when said gantry is within said predetermined y-axis distance of said test site by positioning said test probe to the y-axis position of said test site responsive to (i) said y-axis target signal and (ii) said primary y-axis error signal and (iii) said secondary y-axis error signal.

32. The method of probing a series of test sites of a device under test as defined by claim 31, further comprising the steps of:

(a) engaging said test probe to the said test site for testing said device under test; and (b) disengaging said test probe from said test site upon completion of the testing.

* * * * *